US009632407B2

(12) United States Patent
Sato et al.

(10) Patent No.: US 9,632,407 B2
(45) Date of Patent: Apr. 25, 2017

(54) MASK PROCESSING APPARATUS AND MASK PROCESSING METHOD

(71) Applicant: Kabushiki Kaisha Toshiba, Minato-ku (JP)

(72) Inventors: Hidenori Sato, Yokohama (JP); Manabu Takakuwa, Tsu (JP); Nobuhiro Komine, Nagoya (JP); Taketo Kuriyama, Yokkaichi (JP)

(73) Assignee: Kabushiki Kaisha Yoshiba, Minato-ku (JP)

( * ) Notice: Subject to any disclaimer, the term of this patent is extended or adjusted under 35 U.S.C. 154(b) by 289 days.

(21) Appl. No.: 14/483,805

(22) Filed: Sep. 11, 2014

(65) Prior Publication Data

US 2016/0018730 A1 Jan. 21, 2016

Related U.S. Application Data

(60) Provisional application No. 62/026,418, filed on Jul. 18, 2014.

(51) Int. Cl.

*G03B 27/54* (2006.01)
*G03B 27/62* (2006.01)

(Continued)

(52) U.S. Cl.

CPC ............ *G03F 1/72* (2013.01); *G03F 7/70283* (2013.01); *G03F 7/70425* (2013.01); *G03F 7/70783* (2013.01)

(58) Field of Classification Search

CPC .... G03F 1/72; G03F 7/70191; G03F 7/70283; G03F 7/70425; G03F 7/70783; G03F 7/70866; G03F 7/70875

(Continued)

(56) References Cited

U.S. PATENT DOCUMENTS 6,603,542 B1 8/2003 Chase et al.
7,518,086 B2 4/2009 Norikane et al.

(Continued)

FOREIGN PATENT DOCUMENTS

JP 2005-157375 6/2005
JP 2005-262290 9/2005

(Continued)

OTHER PUBLICATIONS

Avi Cohen, et al., "Correcting Image Placement Errors Using Registration Control (RegC®) Technology in The Photomask Periphery", Proc. of SPIE, vol. 8522, 2012, pp. B5220D-1-85220D-9.

(Continued)

*Primary Examiner* — Christina Riddle

(74) *Attorney, Agent, or Firm* — Oblon, McClelland, Maier & Neustadt, L.L.P.

(57) ABSTRACT

According to an embodiment, a mask processing apparatus is provided. The mask processing apparatus includes a stage, a laser light source and a rotary mechanism. The stage is configured to hold a mask formed with a pattern to be transferred to a transfer target substrate. The laser light source is configured to output laser light that is radiated into the mask and thereby alters the mask. The rotary mechanism is configured to rotate the stage in an in-plane direction of a pattern formation surface of the mask.

17 Claims, 11 Drawing Sheets

16 14 13 15 7 17 10 007

16 14 13 15 7 17 10 007

(51) Int. Cl.

| | |
|---|---|
| ***G03B 27/32*** | (2006.01) |
| ***G03F 1/72*** | (2012.01) |
| ***G03F 7/20*** | (2006.01) |

(58) Field of Classification Search

USPC ..................... 355/52, 53, 55, 67–71, 75, 77; 250/492.1, 492.2, 492.22, 492.23, 493.1, 250/548; 430/5

See application file for complete search history.

(56) References Cited

U.S. PATENT DOCUMENTS

| | | | | |
|---|---|---|---|---|
| 7,904,851 | B2 | 3/2011 | Itoh et al. | |
| 8,124,303 | B2 | 2/2012 | Hiroshima | |
| 8,407,628 | B2 | 3/2013 | Itoh et al. | |
| 8,584,054 | B2 | 11/2013 | Itoh et al. | |
| 2004/0214094 | A1 | 10/2004 | Kim et al. | |
| 2008/0176147 | A1 * | 7/2008 | Wagner | B23K 26/06 430/5 |
| 2010/0321680 | A1 | 12/2010 | Takada | |
| 2012/0009511 | A1 | 1/2012 | Dmitriev | |
| 2012/0084044 | A1 | 4/2012 | Dmitriev | |
| 2012/0154773 | A1 * | 6/2012 | Beyer | G03F 1/72 355/52 |
| 2014/0036243 | A1 | 2/2014 | Beyer et al. | |

FOREIGN PATENT DOCUMENTS

| | | |
|---|---|---|
| JP | 2006-11121 | 1/2006 |
| JP | 2006-284595 | 10/2006 |
| JP | 2008-26822 | 2/2008 |
| JP | 2010-15203 | 1/2010 |
| JP | 2010-44287 | 2/2010 |
| JP | 2010-145800 | 7/2010 |
| JP | 2010-152031 | 7/2010 |
| JP | 2011-2305 | 1/2011 |
| JP | 2012-22323 | 2/2012 |
| JP | 2012-88712 | 5/2012 |
| JP | 2014-504376 | 2/2014 |

OTHER PUBLICATIONS

Erez Graitzer, et al., "Closed Loop Registration Control (RegC®) Using PROVE® as the Data Source for the RegC® Process", Proc. of SPIE, vol. 8441, 2012, pp. 84410A-1-84410A-9.

* cited by examiner 5
13
7
14
16
17
10
11
12
15

MASK PROCESSING APPARATUS AND MASK PROCESSING METHOD

CROSS-REFERENCE TO RELATED APPLICATIONS

This application is based upon and claims the benefit of priority from U.S. Provisional Application No. 62/026,418, filed on Jul. 18, 2014; the entire contents of which are incorporated herein by reference.

FIELD

Embodiments described herein relate generally to a mask processing apparatus, mask processing method and recording medium.

BACKGROUND

In a process for manufacturing a semiconductor device including semiconductor elemental devices, such as a transistor, a lithography technique is used to realize miniaturization of patterns. As one of the challenges this lithography technique faces, there is a need to improve overlay accuracy between layers.

In light of this, there is a conventional technique of radiating femtosecond laser into the glass of a photomask to alter the glass and thereby to correct mask pattern positions. In this mask pattern correction by use of irradiation with femtosecond laser, it is required to perform the correction with high accuracy in a short time.

DETAILED DESCRIPTION

According to an embodiment, a mask processing apparatus is provided. The mask processing apparatus comprises a stage, a laser light source and a rotary mechanism. The stage is configured to hold a mask formed with a pattern to be transferred to a transfer target substrate. The laser light source is configured to output laser light that is radiated into the mask and thereby alters the mask. The rotary mechanism is configured to rotate the stage in an in-plane direction of a pattern formation surface of the mask.

Exemplary embodiments of a mask processing apparatus, mask processing method and recording medium will be explained below in detail with reference to the accompanying drawings. The present invention is not limited to the following embodiments.

(First Embodiment)

Figure 1:
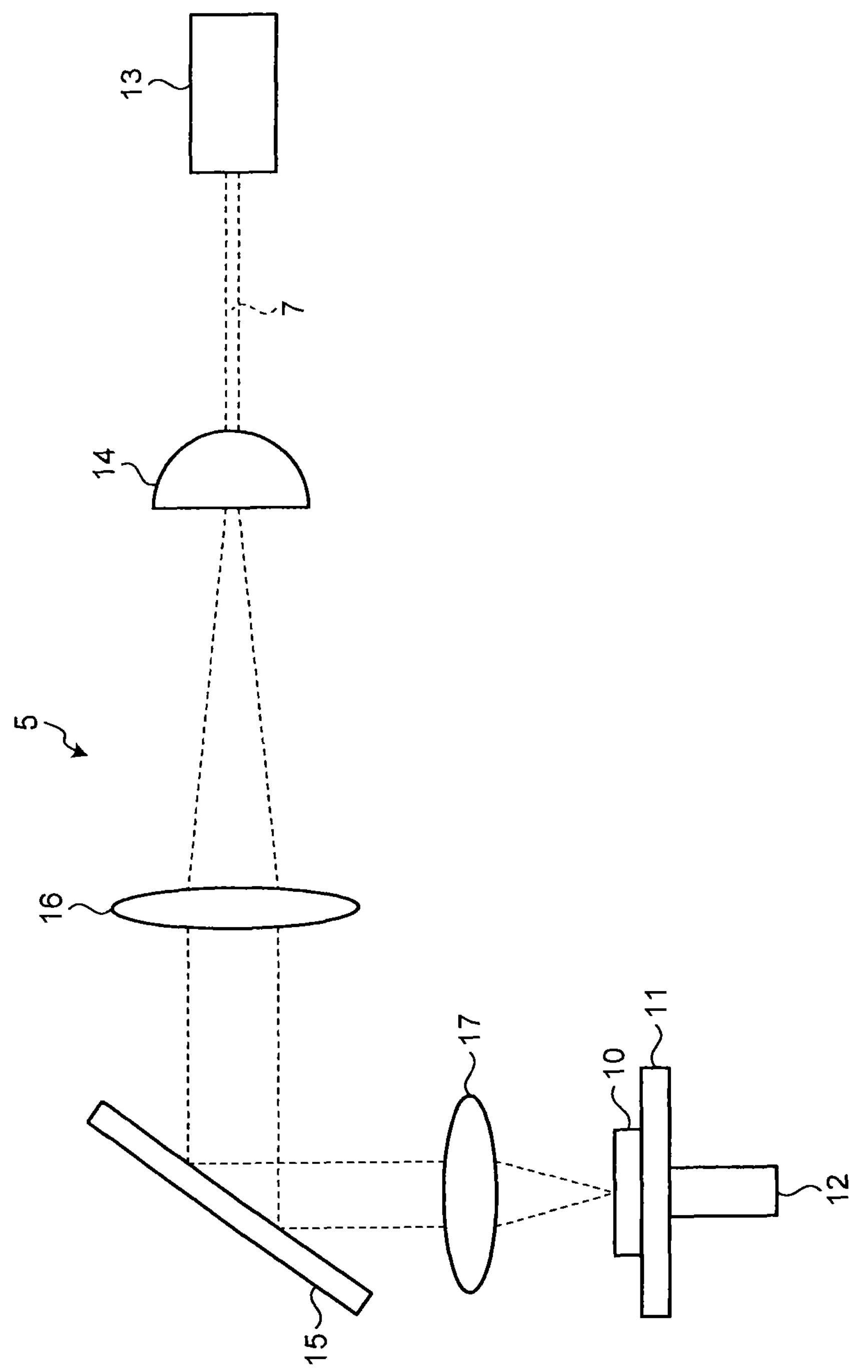
FIG. 1 is a diagram showing a configuration of a mask processing mechanism included in a mask processing apparatus according to an embodiment.

FIG. 1 is a diagram showing a configuration of a mask processing mechanism included in a mask processing apparatus according to an embodiment. The mask processing mechanism 5 irradiates a mask 10 with laser light 7, such as femtosecond laser, to alter the mask 10. Consequently, the position of a mask pattern is adjusted, and a positional deviation of the mask pattern is thereby corrected.

The mask 10 is a photomask used for photolithography or an imprint mask (template) used for imprint lithography. The mask 10 is formed by use of a glass substrate or the like.

The mask 10 is a pattern transfer plate formed with a mask pattern. When photolithography or imprint lithography is performed, the mask pattern is transferred onto a transfer target substrate, such as a wafer.

The mask processing mechanism 5 alters the inside of the glass of the mask 10 to adjust the position of the mask pattern. For example, the mask processing mechanism 5 includes a function of a positioning control tool.

A plurality of deformation modes are set up for the laser light 7 used for the mask processing. The deformation modes correspond to irradiation shapes (beam shapes) of the laser light 7 to be radiated into the mask 10. If the deformation amounts of the irradiation shapes are different between these deformation modes, the correction accuracy is lowered, and so extra condition setting is required when the mask processing is applied. The mask processing mechanism 5 according to this embodiment reduces the differences in the deformation amounts between the deformation modes, so as to perform correction with high accuracy and to smoothly apply the mask processing.

The mask processing mechanism 5 includes a stage 11 for holding the mask 10 and a rotary mechanism 12 for rotating the stage 11. Further, the mask processing mechanism 5 includes a laser light source 13, an optical element 14, a mirror 15, and lenses 16 and 17.

The laser light source 13 generates the laser light 7 to be radiated into the mask 10 and emits it to the optical element 14. The optical element 14 transforms the spot diameter of the laser light 7 to an anisotropic shape, such as an elliptical shape. The laser light 7 transformed into an elliptical shape by the optical element 14 is radiated into the mask 10 via the mirror 15 and the lenses 16 and 17.

The mask processing mechanism 5 according to this embodiment rotates the stage 11 by the rotary mechanism 12 and thereby rotates the mask 10 held by the stage 11, in the mask plane. The mask 10 can be rotated by first to "n"-th angles ("n" is a natural number of 2 or more), so that it is irradiated with the laser light 7 in states respectively having first to "n"-th rotation angles, respectively. In this way, according to this embodiment, the mask 10 itself is rotated in place of the optical element 14, and a plurality of deformation modes are thereby set up for the laser light 7.

Figure 2:
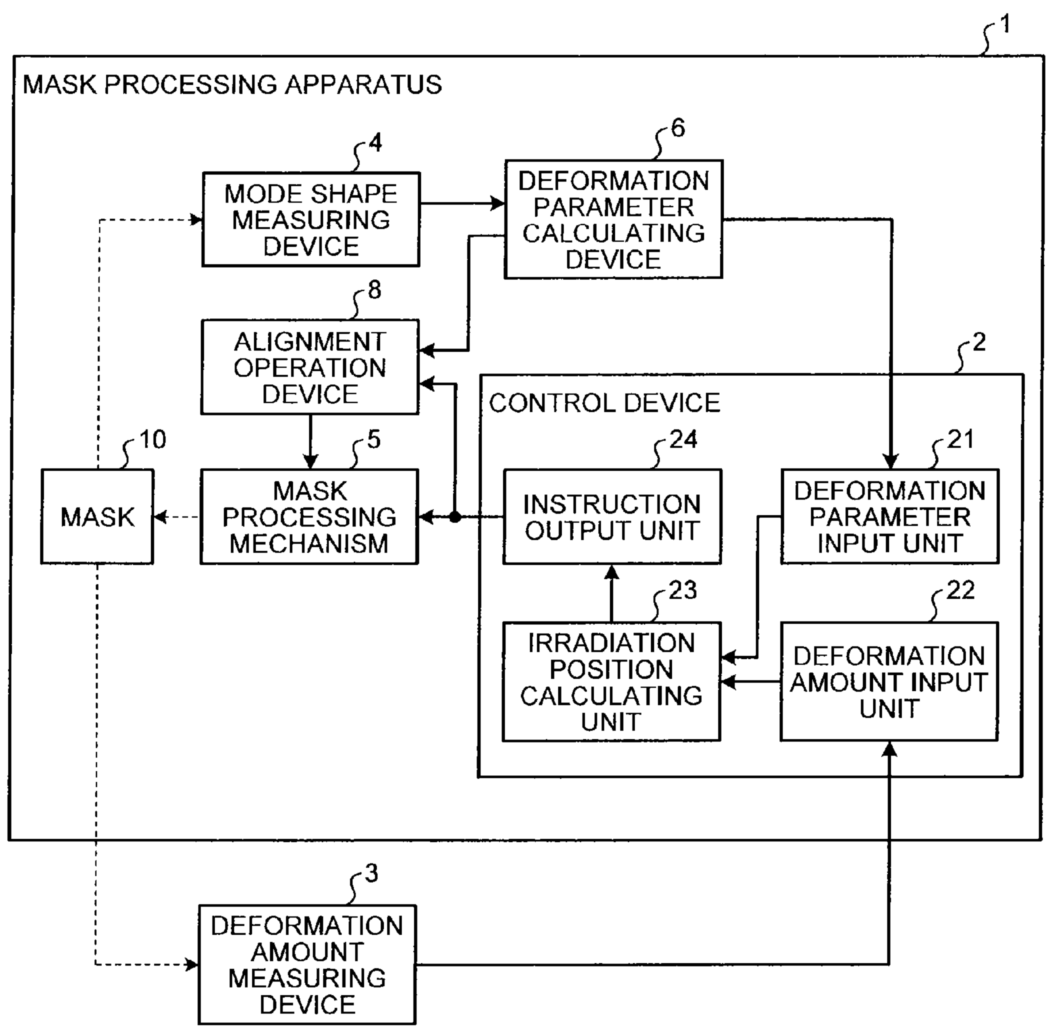
FIG. 2 is a diagram showing a configuration of a mask processing apparatus according to the embodiment.

FIG. 2 is a diagram showing a configuration of a mask processing apparatus according to the embodiment. The mask processing apparatus 1 includes a control device 2, a mask processing mechanism 5, a mode shape measuring device 4, a deformation parameter calculating device 6, and an alignment operation device 8.

Further, the mask processing apparatus 1 is connected to a deformation amount measuring device 3. The deformation amount measuring device 3 measures the mask 10 in terms of the deformation amount of the mask pattern. Specifically, the deformation amount measuring device 3 measures a positional deviation amount between an actual position of the mask pattern and a desired position of the mask pattern, as the deformation amount of the mask 10. The deformation amount measuring device 3 sends the deformation amount thus measured to the control device 2 as a mask deformation amount. The mask processing apparatus 1 is not necessarily required to be connected to the deformation amount measuring device 3. In this case, a mask deformation amount measured by the deformation amount measuring device is sent to the control device 2 by a portable recording medium.

The mode shape measuring device 4 measures the deformation mode shape of the laser light 7 to be radiated into the mask 10. The deformation mode shape is the irradiation shape of the laser light 7 to be radiated into the mask 10, when the mask 10 is placed at the reference position.

The mode shape measuring device 4 measures the deformation mode shape of the laser light 7 to be radiated into the mask 10, for example, when the first rotation angle is set at 0°. The mode shape measuring device 4 measures the deformation mode shape by use of a substrate or the like for measuring the deformation mode shape. The mode shape measuring device 4 sends the deformation mode shape thus measured to the deformation parameter calculating device 6.

The deformation parameter calculating device 6 calculates a deformation parameter representing the irradiation shape of the laser light 7 relative to the mask 10, based on the deformation mode shape. This deformation parameter is a parameter representing the irradiation shape when the irradiation shape of the laser light 7 is viewed from the reference position, and it is denoted by a vector or the like from the reference position.

Hereinafter, the deformation parameter at a reference rotation angle, calculated by the deformation parameter calculating device 6, may be referred to as a reference deformation parameter. Further, the first rotation angle of the mask 10, used when the mode shape measuring device 4 measures the deformation mode shape, may be referred to as the reference rotation angle.

Further, the deformation parameter calculating device 6 calculates deformation parameters when the mask 10 is set at second to "n"-th rotation angles from the reference rotation angle, respectively. For example, a deformation parameter for when the mask 10 is set at an "M"-th rotation angle ("M" is a natural number of 2 to "n") from the reference rotation angle corresponds to a parameter obtained by rotating the reference deformation parameter by the "M"-th rotation angle.

Hereinafter, the deformation parameter at the "M"-th rotation angle, calculated by the deformation parameter calculating device 6, may be referred to as a calculated deformation parameter. Further, the deformation parameters corresponding to the first to "n"-th rotation angles may be referred to as first to "n"-th deformation parameters, respectively. For example, the deformation parameter calculating device 6 calculates an "M"-th deformation parameter by rotating the reference deformation parameter by an amount corresponding to the difference between the reference rotation angle and the "M"-th rotation angle.

The deformation parameter calculating device 6 sends the reference deformation parameter and the calculated deformation parameters, thus calculated, to the control device 2. Further, the deformation parameter calculating device 6 sends the first to "n"-th rotation angles to the alignment operation device 8.

Based on the mask deformation amounts, the reference deformation parameter and the calculated deformation parameters, the control device 2 controls the rotary mechanism 12 and the laser light source 13 of the mask processing mechanism 5. The control device 2 includes a deformation parameter input unit 21, a deformation amount input unit 22, an irradiation position calculating unit 23 and an instruction output unit 24. The deformation parameter input unit 21 receives inputs of the reference deformation parameter and the calculated deformation parameters sent from the deformation parameter calculating device 6. The deformation parameter input unit 21 sends the reference deformation parameter and the calculated deformation parameters to the irradiation position calculating unit 23. The deformation amount input unit 22 receives inputs of the mask deformation amounts sent from the deformation amount measuring device 3. The deformation amount input unit 22 sends the mask deformation amounts to the irradiation position calculating unit 23.

The irradiation position calculating unit 23 sets up an irradiation position of the laser light 7 to be radiated into the mask 10 for each of the deformation parameters. The irradiation position calculating unit 23 sets up irradiation positions of the laser light 7 respectively for the deformation parameters for when the mask 10 is set at the first to "n"-th rotation angles.

Based on the mask deformation amounts, the reference deformation parameter and the calculated deformation parameters, the irradiation position calculating unit 23 calculates the irradiation positions of the laser light 7. The irradiation position calculating unit 23 calculates the respective irradiation positions of the laser light 7 to cancel the mask deformation at the respective pattern regions of the mask 10 and to make the alteration amounts constant at the respective pattern regions of the mask 10.

For example, when the irradiation positions of the laser light 7 are set up respectively for the first to "n"-th deformation parameters in relation to a first pattern region, the transmittance at the first pattern region is lowered by a level effected by combining radiation amounts corresponding to the first to "n"-th deformation parameters. The irradiation position calculating unit 23 sets up the irradiation positions of the laser light 7, so that the transmittances (haze degrees), which are alteration amounts of the mask 10, at the respective pattern regions, become the same preset value. The irradiation position calculating unit 23 sends the irradiation positions of the laser light 7, set up respectively for the deformation parameters, to the instruction output unit 24.

Based on the irradiation positions of the laser light 7 set up respectively for the deformation parameters, the instruction output unit 24 generates instructions directed to the mask processing mechanism 5. The instructions directed to the mask processing mechanism 5 include a rotation instruction directed to the rotary mechanism 12 and a radiation instruction indicating the irradiation positions of the laser light 7.

The instruction output unit 24 outputs the radiation instruction for the laser light 7 and the rotation instruction for the mask 10 to the mask processing mechanism 5. Further, the instruction output unit 24 sends an alignment instruction to the alignment operation device 8.

Based on the rotation instruction from the control device 2, the mask processing mechanism 5 rotates the rotary mechanism 12. Further, based on the radiation instruction from the control device 2, the mask processing mechanism 5 radiates the laser light 7, such as femtosecond laser, into the mask 10.

The alignment operation device 8 performs an alignment operation of the mask 10 held by the stage 11. When the stage 11 is rotated by the first to "n"-th rotation angles along with the mask 10, the alignment operation device 8 performs an alignment operation of the mask 10 at each of the rotation angles. The alignment operation device 8 calculates an alignment correction amount (coordinate correction amount) to place the mask 10 at a desired position, based on a detected position of an alignment mark formed on the mask 10. The alignment operation device 8 performs an alignment operation of the mask 10 based on the position correction amount of the mask 10.

For example, in the mask processing apparatus 1, the stage 11 is rotated by an "N"-th rotation angle ("N" is a natural number of 1 to "n"), and an alignment operation of the mask 10 is performed at this "N"-th rotation angle. Then, the laser light 7 is radiated into the mask 10 having been subjected to the alignment operation. At this time, the laser light 7 is radiated to an irradiation position set up for the N"-th deformation parameter corresponding to the "N"-th rotation angle. Consequently, the laser light 7 is radiated into the mask 10 by use of the "N"-th deformation parameter.

Figure 3A:
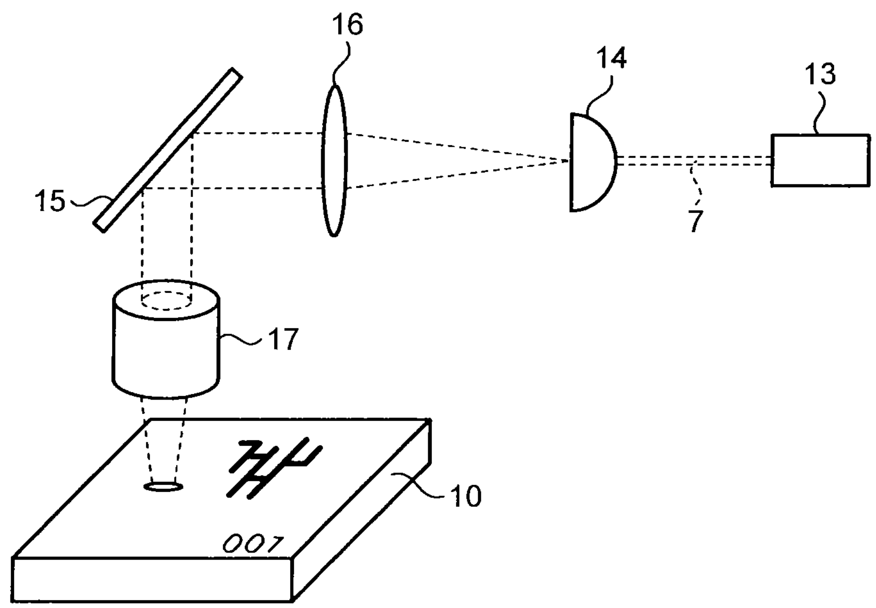
FIG. 3A is a view for explaining a mask placed at a position corresponding to a reference rotation angle.
Figure 3B:
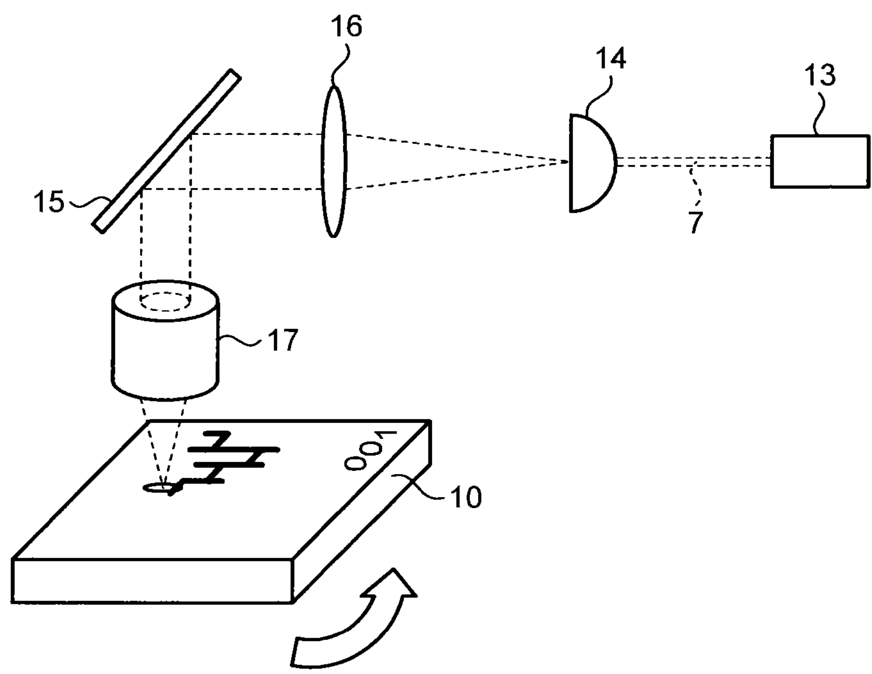
FIG. 3B is a view for explaining the mask placed at a position rotated by 90° from the reference rotation angle.

FIG. 3A is a view for explaining the mask placed at a position corresponding to the reference rotation angle. FIG. 3B is a view for explaining the mask placed at a position rotated by 90° from the reference rotation angle.

According to this embodiment, in relation to the mask 10 placed at the position corresponding to the reference rotation angle shown in FIG. 3A, a deformation mode shape of the laser light 7 is measured. Then, based on the deformation mode shape thus measured, the reference deformation parameter is calculated.

Further, in relation to the mask 10 placed at the position rotated by 90° from the reference rotation angle, a calculated deformation parameter is calculated. Each of the reference deformation parameter and the calculated deformation parameter shows a beam shape of the laser light 7 relative to the mask pattern. Accordingly, even if beam shapes of the laser light 7 radiated toward the stage 11 are the same, the beam shapes of the laser light 7 viewed from the mask pattern are changed, when the mask 10 is rotated in the mask plane.

Figure 4A:
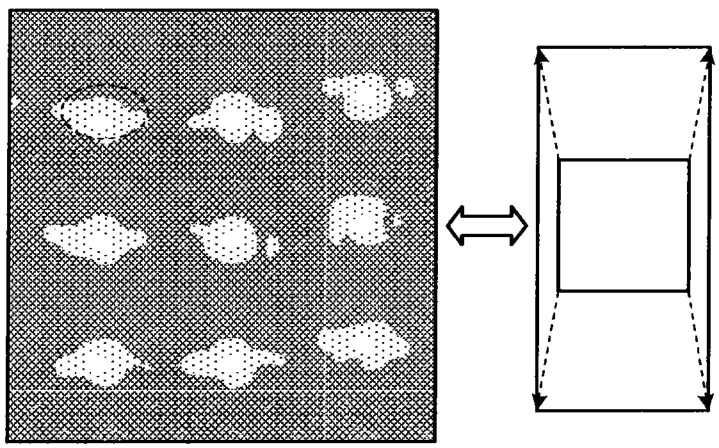
FIG. 4A is a view for explaining a laser light beam shape and a reference deformation parameter, where the mask is placed at the position corresponding to the reference rotation angle.
Figure 4A:
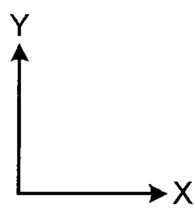
Figure 4B:
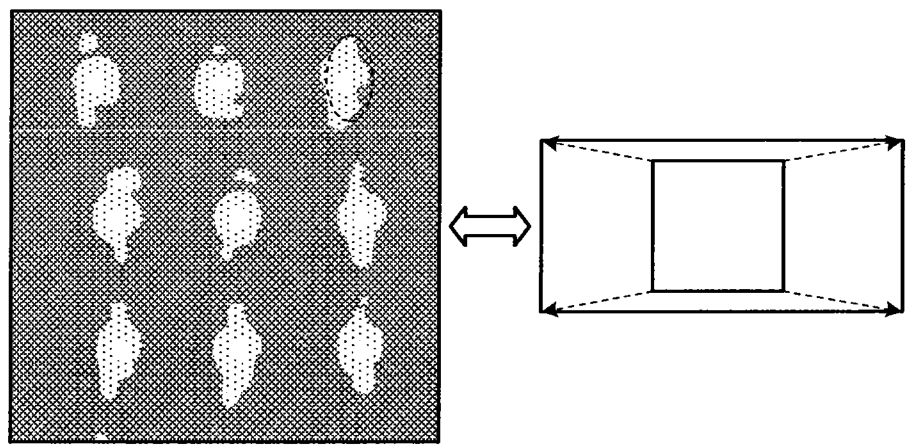
FIG. 4B is a view for explaining a laser light beam shape and a calculated deformation parameter, where the mask is rotated by 90° from the reference rotation angle.
Figure 4B:
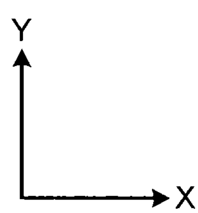

FIG. 4A is a view for explaining a laser light beam shape and a reference deformation parameter, where the mask is placed at the position corresponding to the reference rotation angle. FIG. 4B is a view for explaining a laser light beam shape and a calculated deformation parameter, where the mask is rotated by 90° from the reference rotation angle.

For example, the beam shape of the laser light 7 is an elliptical shape. It is assumed that, when the mask 10 is placed at the position corresponding to the reference rotation angle, the longitudinal direction of the elliptical shape is in an X-axis direction. In this case, when the mask 10 is rotated by 90° from the reference rotation angle, the longitudinal direction of the elliptical shape is in a Y-axis direction. When the longitudinal direction of the elliptical shape is in the X-axis direction, the deformation parameter is, for example, an oblong rectangular shape whose longitudinal direction is in the Y-axis direction. Further, when the longitudinal direction of the elliptical shape is in the Y-axis direction, the deformation parameter is, for example, an oblong rectangular shape whose longitudinal direction is in the X-axis direction.

In FIG. 4A, a deformation parameter for when the mask 10 is placed at the position corresponding to the reference rotation angle is shown as an oblong rectangular shape whose longitudinal direction is in the Y-axis direction. In FIG. 4B, a deformation parameter for when the mask 10 is placed at the position rotated by 90° from the reference rotation angle is shown as an oblong rectangular shape whose longitudinal direction is in the X-axis direction.

As shown in FIG. 4A, the deformation mode at the reference rotation angle is an X-axis direction mode that is "vertical". Further, as shown in FIG. 4B, the deformation mode in a state rotated by 90° from the reference rotation angle is a Y-axis direction mode that is "horizontal".

According to this embodiment, a plurality of deformation modes are set up for the laser light 7 by rotating the mask 10 itself without changing the rotation position of the optical element 14 set in measuring the deformation mode shape. Then, the irradiation position calculating unit 23 calculates the first to "n"-th deformation parameters for when the mask 10 is set at the first to "n"-th rotation angles, respectively.

For example, the irradiation position calculating unit 23 calculates a first deformation parameter as the reference deformation parameter, for when the mask 10 is set at a first rotation angle. Further, the irradiation position calculating unit 23 calculate a second deformation parameter as a calculated deformation parameter, for when the mask 10 is set at a second rotation angle. The first rotation angle is, for example, 0° and the second rotation angle is, for example, 90°.

Figure 5:
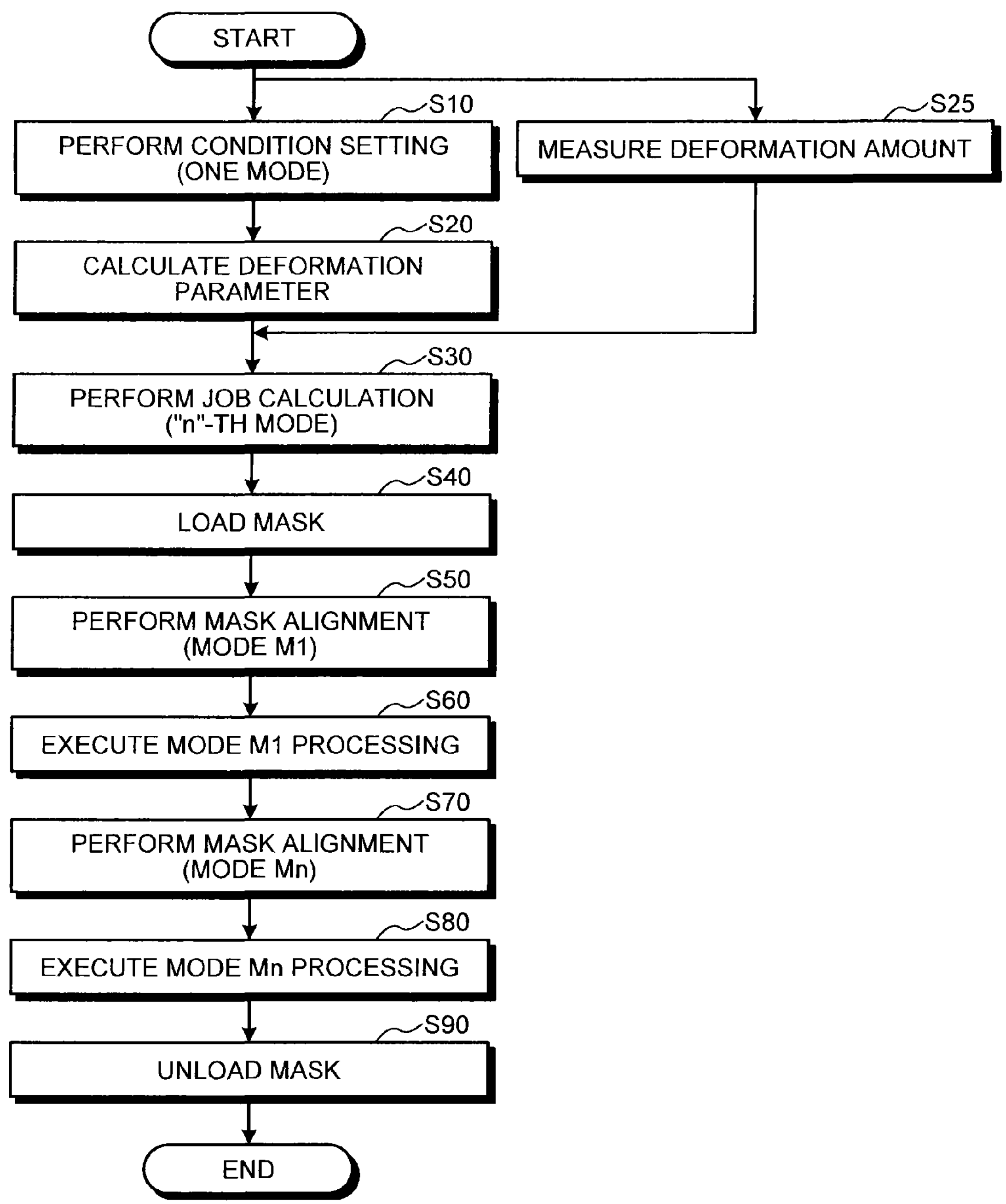
FIG. 5 is a flow chart showing a sequence of processing operations performed to a mask.

Next, an explanation will be given of a sequence of processing operations performed to the mask 10. FIG. 5 is a flow chart showing a sequence of processing operations performed to the mask. Before starting the processing of the mask 10, the mask processing apparatus 1 performs condition setting in relation to the mask processing (step S10). The condition setting is directed to one deformation mode (one mode). For example, the mask processing apparatus 1 utilizes a board for setting conditions to perform the condition setting in relation to the mask processing.

The mask processing apparatus 1 performs processing operations peculiar to the mask processing apparatus 1, in accordance with the states of the optical element 14, the mirror 15, the lenses 16 and 17 and so forth. For example, the processing operations to be performed in the mask processing apparatus 1 can be affected by positional deviations or the like caused by distortions of the optical element 14, the mirror 15, the lenses 16 and 17 and so forth. In light of this, the condition setting in relation to the mask processing includes performing measurement of a deformation mode shape (beam shape) representing an irradiation shape of the laser light 7.

Specifically, the mode shape measuring device 4 performs measurement of the deformation mode shape at the reference rotation angle. Then, based on the deformation mode shape, the deformation parameter calculating device 6 calculates a deformation parameter of the laser light 7. The deformation parameter calculated at this time is the reference deformation parameter.

Further, the deformation parameter calculating device 6 calculates the second to "n"-th deformation parameters by use of the reference deformation parameter. Each of the deformation parameters calculated by the deformation parameter calculating device 6 can be a deformation parameter corresponding to any rotation angle. For example, the deformation parameter calculating device 6 calculates a deformation parameter for when the mask 10 is rotated by 60° from the reference rotation angle. Further, the deformation parameter calculating device 6 calculates a deformation parameter for when the mask 10 is rotated by 120° from the reference rotation angle (step S20).

The deformation parameter calculating device 6 sends the reference deformation parameter and the calculated deformation parameters to the control device 2. Further, the deformation parameter calculating device 6 sends the first to "n"-th rotation angles to the alignment operation device 8.

Further, the deformation amount measuring device 3 measures the distribution of the deformation amounts of the mask 10 for the respective pattern regions of the mask 10 (step S25). The pattern regions are set up in advance in a matrix format on the mask 10. For example, each of the pattern regions has a rectangular shape. The control device 2 may use the irradiation position calculating unit 23 to divide the distribution of the deformation amounts of the mask 10 for the respective pattern regions.

The deformation amount measuring device 3 measures the positional deviation amount between an actual position of the mask pattern and a desired position of the mask pattern, as a deformation amount of the mask 10. The deformation amount measuring device 3 sends the deformation amount thus measured, as a mask deformation amount, to the control device 2.

The irradiation position calculating unit 23 of the control device 2 performs a Job calculation (step S30). This Job calculation is an operation of calculating irradiation positions of the laser light 7 for the respective deformation parameters. Specifically, the irradiation position calculating unit 23 calculates an irradiation position of the laser light 7 to be radiated into the mask 10 at the reference rotation position. Further, the irradiation position calculating unit 23 calculates an irradiation position of the laser light 7 to be radiated into the mask 10 rotated by 60° from the reference rotation angle, for example. Further, the irradiation position calculating unit 23 calculates an irradiation position of the laser light 7 to be radiated into the mask 10 rotated by 120° from the reference rotation angle, for example.

For example, a deformation parameter for when the mask 10 is rotated by a first angle from the reference rotation angle corresponds to a parameter obtained by rotating the deformation parameter at the reference rotation angle by the first angle. Accordingly, the irradiation position calculating unit 23 can easily calculate the deformation parameter for when the mask 10 is rotated by the first angle from the reference rotation angle. Thus, the irradiation position calculating unit 23 can easily calculate an irradiation position of the laser light 7 for when the mask 10 is rotated by a predetermined rotation angle from the reference rotation angle.

The condition setting in relation to the mask processing is an operation to be performed for every mask processing apparatus 1. Further, the deformation amount measuring operation by the deformation amount measuring device 3 and the Job calculation executing operation by the irradiation position calculating unit 23 are operations to be performed for every mask 10.

The irradiation position calculating unit 23 sends the irradiation positions of the laser light 7, set up for the respective deformation parameters, to the instruction output unit 24. Thereafter, the instruction output unit 24 outputs a processing start instruction for processing the mask 10 to the mask processing mechanism 5. When the mask processing mechanism 5 receives the processing start instruction, it loads the mask 10 into the mask processing mechanism 5 and places the mask 10 onto the stage 11 (step S40).

Further, the instruction output unit 24 sends a rotation instruction, for processing the mask 10 by use of the deformation mode shape of a mode M1, to the mask processing mechanism 5. Consequently, the rotary mechanism 12 rotates the stage 11 to set the mask 10 at the rotation angle of the mode M1.

Further, the instruction output unit 24 outputs an alignment instruction, for processing the mask 10 by use of the deformation mode shape of the mode M1, to the alignment operation device 8. Consequently, the alignment operation device 8 performs mask alignment of the mask 10, for processing the mask 10 by use of the deformation mode shape of the mode M1 (step S50). At this time, the alignment operation device 8 performs the alignment operation of the mask 10 after the mask 10 is rotated by the stage 11 to be at the rotation angle of the mode M1.

The operation of processing the mask 10 by use of the deformation mode shape of the mode M1 is an operation of processing the mask 10 by use of a deformation parameter corresponding to the deformation mode shape of the mode M1 (which will be referred to as mode M1 processing, hereinafter). Accordingly, the mask 10 is subjected to mask alignment to have a rotation angle at which the mode M1 processing can be performed.

Further, the instruction output unit 24 outputs an instruction (radiation instruction) for executing the mode M1 processing to the mask processing mechanism 5. Consequently, the mask processing mechanism 5 executes the mode M1 processing (step S60). For example, the mode M1 processing is processing performed to the mask 10 at the reference rotation angle.

Thereafter, the instruction output unit 24 sends a rotation instruction, for processing the mask 10 by use of the deformation mode shape of a mode Mn, to the mask processing mechanism 5. Consequently, the rotary mechanism 12 rotates the stage 11 to set the mask 10 at the rotation angle of the mode Mn.

Further, the instruction output unit 24 outputs an alignment instruction, for processing the mask 10 by use of the deformation mode shape of the mode Mn ("n" is a natural number), to the alignment operation device 8. Consequently, the alignment operation device 8 performs mask alignment of the mask 10, for processing the mask 10 by use of the deformation mode shape of the mode Mn (step S70). At this time, the alignment operation device 8 performs the alignment operation of the mask 10 after the mask 10 is rotated by the stage 11 to be at the rotation angle of the mode Mn.

The operation of processing the mask 10 by use of the deformation mode shape of the mode Mn is an operation of processing the mask 10 by use of a deformation parameter corresponding to the deformation mode shape of the mode Mn (which will be referred to as mode Mn processing, hereinafter). Accordingly, the mask 10 is subjected to mask alignment to have a rotation angle at which the mode Mn processing can be performed.

Further, the instruction output unit 24 outputs an instruction for executing the mode Mn processing to the mask processing mechanism 5. Consequently, the mask processing mechanism 5 executes the mode Mn processing (step S80). For example, the mode Mn processing is processing performed to the mask 10 rotated by 60° or 120° from the reference rotation angle.

In the operations of the steps S70 and S80, the instruction output unit 24 sequentially outputs mask alignment instructions corresponding to all the deformation mode shapes already set up, and instructions for executing mode Mm processing ("m"=2, 3, . . . , "n"), in order, to the mask processing mechanism 5. Consequently, the mask processing mechanism 5 repeats mask alignment of the mask 10, for processing the mask 10 by use of the deformation mode shape of the mode Mm, and the mode Mm processing, in order. After the last mode Mm processing is completed, the mask processing mechanism 5 performs mask unloading of the mask 10 (step S90).

Incidentally, there is a method of rotating the optical element 14 to execute processing of the mask 10 by use of two different deformation mode shapes. According to this method of rotating the optical element 14, the deformation mode shapes are set up in accordance with the rotation angle of the optical element 14, and the processing of the mask 10 is performed with deformation parameters corresponding to the deformation mode shapes thus set up.

However, in the case of the method of rotating the optical element 14, the deformation mode shape of the laser light 7 radiated into the mask 10 varies depending on the rotation angle of the optical element 14. This is caused by aberrations of the lenses 16 and 17 and/or in-plane variations in the reflectance of the mirror 15.

In this case, the optical conditions are different for the respective deformation mode shapes, and so the deformation parameter is not a rotation target. Accordingly, it is necessary to perform condition setting for each of the deformation mode shapes. Thus, in the case of the method of rotating the optical element 14, it takes a long time to perform the condition setting.

Figure 6:
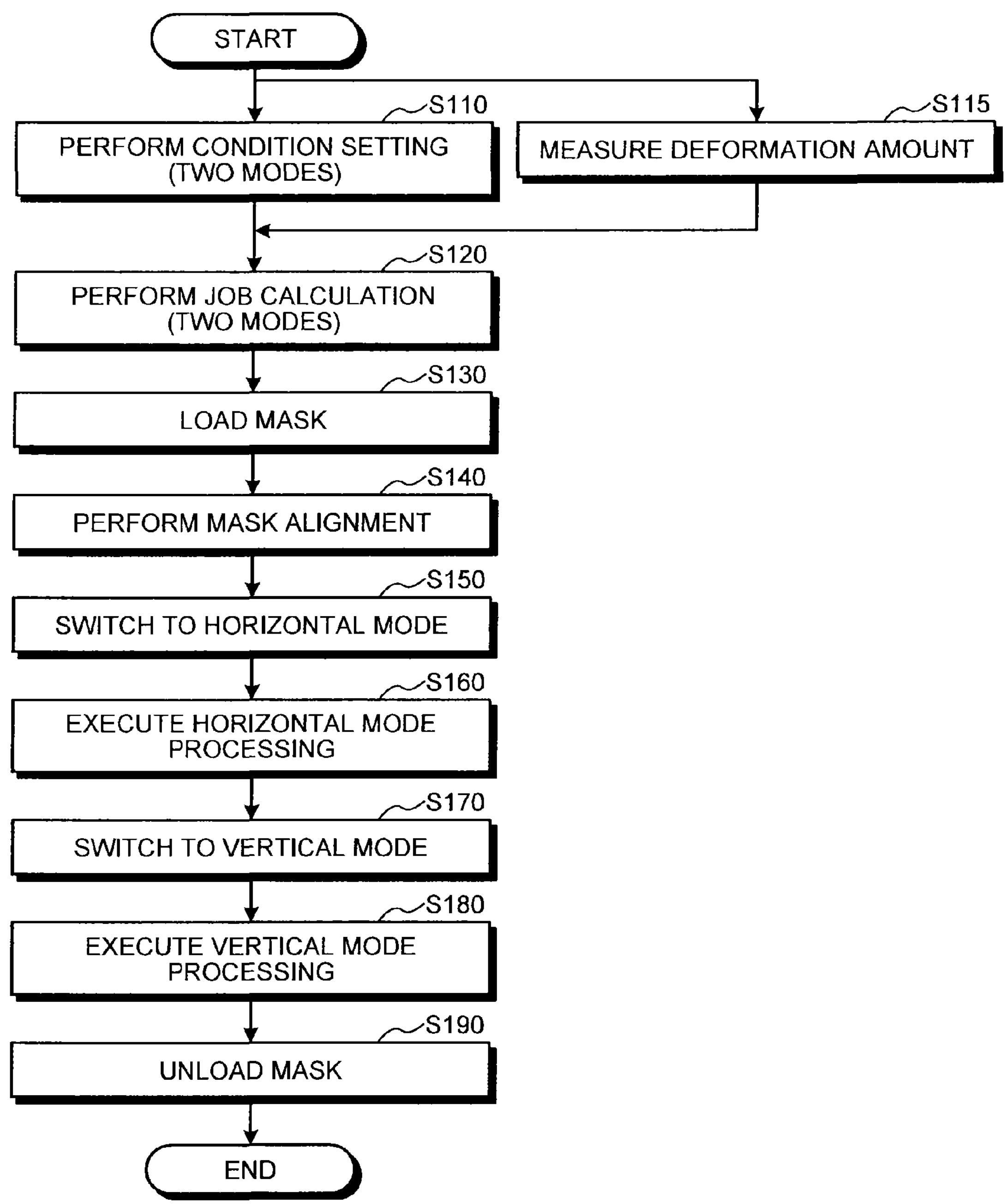
FIG. 6 is a flow chart showing a sequence of processing operations performed to a mask in a case where an optical element is rotated.

FIG. 6 is a flow chart showing a sequence of processing operations performed to the mask in a case where the optical element is rotated. Hereinafter, in this case, a sequence of processing operations performed to the mask 10 will be explained on the premise that the optical element is rotated in a mask processing apparatus 100 not shown.

Before starting the processing of the mask 10, the mask processing apparatus 100 performs condition setting in relation to the mask processing (step S110). The condition setting is directed to two deformation modes (two modes). For example, the condition setting is performed for two modes: a deformation mode shape (vertical mode) for when the rotation position of the optical element 14 is set at the reference position, and a deformation mode shape (horizontal mode) for when the rotation position of the optical element 14 is set in a state rotated by 90° from the reference position.

The mask processing apparatus 100 measures the deformation mode shape at the reference rotation angle, and calculates a deformation parameter of the laser light 7 based on this measurement result. Further, the mask processing apparatus 100 measures the deformation mode shape in a state rotated by 90° from the reference rotation angle shape, and calculates a deformation parameter of the laser light 7 based on this measurement result.

Further, the mask processing apparatus 100 measures deformation amounts of the mask 10 for the respective pattern regions of the mask 10 (step S115). Then, the mask processing apparatus 100 performs a Job calculation (step S120). This Job calculation is an operation of calculating irradiation positions of the laser light 7 for the respective deformation parameters.

Thereafter, the mask 10 is loaded into a mask processing mechanism (not shown) inside the mask processing apparatus 100 (step S130). Then, mask processing apparatus 100 performs mask alignment of the mask 10 for processing the mask 10 (step S140).

Thereafter, the mask processing apparatus 100 switches the mask processing setting to a setting for processing the mask 10 by use of a horizontal deformation mode shape (step S150). Then, the mask processing apparatus 100 executes processing of the mask 10 by use of the horizontal deformation mode shape (step S160).

Further, the mask processing apparatus 100 switches the mask processing setting to a setting for processing the mask 10 by use of a vertical deformation mode shape (step S170). Then, the mask processing apparatus 100 executes processing of the mask 10 by use of the vertical deformation mode shape (step S180). Then, the mask processing mechanism performs mask unloading of the mask 10 (step S190).

As described above, in a case where the two deformation mode shapes are set up by rotating the optical element 14, condition setting is performed for the two deformation mode shapes, and so it takes a long time to perform the condition setting.

On the other hand, in a case where the two deformation mode shapes are set up by rotating the mask 10, condition setting needs to be performed only to one deformation mode shape, and so it becomes possible to perform the condition setting in a short time.

According to the mask processing apparatus 1, position correction for the mask pattern is performed, for example, to every mask 10 used for wafer processing. Then, semiconductor devices (semiconductor integrated circuits) are manufactured by use of the mask 10, in which the positional deviation of the mask pattern has been corrected, as needed. Specifically, a resist is applied onto a transfer target substrate, such as a wafer, and then a resist pattern is formed thereon by use of the mask 10, in which the positional deviation of mask pattern has been corrected. At this time, if the mask 10 is a photomask, photolithography is performed by use of the mask 10. Further, if the mask 10 is a template, imprint lithography is performed by use of the mask 10.

After the resist pattern is formed, a film below the resist pattern is etched through the resist pattern serving as a mask. Consequently, an actual pattern corresponding to the resist pattern is formed on the transfer target substrate. In the process for manufacturing semiconductor devices, the deformation parameter calculating operation, the irradiation position calculating operation, the mask 10 processing operation, the resist pattern forming operation and the etching operation, described above, are repeated for every layer.

It should be noted that the deformation parameter calculating device 6 may be provided in the control device 2. Further, the alignment operation device 8 may be provided in the mask processing mechanism 5. Further, the alignment operation device 8 may be provided in the control device 2. Further, the mode shape measuring device 4 may be provided separately from the mask processing apparatus 1. Further, the mask processing apparatus 1 may include the deformation amount measuring device 3.

Further, the mask processing apparatus 1 may correct linear component positional deviations of the mask pattern.

In this case, the mask processing apparatus 1 adjusts the position of the lenses 16 and 17 or stage 11, and thereby corrects the linear component positional deviations of the mask pattern.

Further, the mask processing mechanism 5 may irradiate the mask 10 with laser light other than the femtosecond laser. For example, the mask processing mechanism 5 may irradiate the mask 10 with a laser selected from the femtosecond laser to picosecond laser.

According to this embodiment, the mask processing apparatus 1 includes the rotary mechanism 12 configured to rotate the stage 11 in the in-plane direction of the pattern formation surface of the mask 10. Consequently, the mask processing apparatus 1 can easily irradiate the mask 10 with the laser light 7 while setting it in a plurality of deformation mode shapes by rotating the mask 10.

As described above, the mask processing apparatus 1 rotates the mask 10, and so it can realize rotational symmetric processing among the deformation modes without changing the laser light path for every deformation mode. Consequently, the pattern position of the mask 10 can be corrected in a short time.

Further, since the mask 10 is rotated, a deformation mode at an arbitrary angle can be easily set up in accordance with the rotation angle. Consequently, three or more different deformation parameters can be used for processing the mask 10, so that the mask 10 can be corrected with high accuracy Thus, the first embodiment can provide an effect that allows the correction of the mask 10 to be performed with high accuracy in a short time.

(Second Embodiment)

Next, an explanation will be given of a second embodiment of the present invention, with reference to FIGS. 7A to 11. In the second embodiment, the mask processing apparatus 1 sets up irradiation positions of the laser light 7 by dividing the pattern formation region on the mask 10 into pattern regions having a regular hexagonal shape or regular triangle shape, so that the transmittances of the respective pattern regions are equal to each other.

The mask 10 is processed such that the transmittance obtained by overlaying the respective deformation modes is constant in the mask plane to prevent the dimension uniformity of the mask pattern from being deteriorated. Accordingly, each of the deformation modes is divided into predetermined shapes, and the mask pattern position correction and the transmittance setup are performed for every predetermined shape. Specifically, the pattern formation region of the mask 10 is divided into predetermined pattern regions, and the transmittance setup is performed for each of the pattern regions, so that the transmittances of the respective pattern regions are equal to each other. For example, as regards the first pattern region, irradiation positions of the laser light 7 are set up for the first to "n"-th deformation parameters, so that the transmittance of the first pattern region, obtained when all of the first to "n"-th deformation parameters are used for the processing, is the same as the transmittances of the other pattern regions.

Figure 7A:
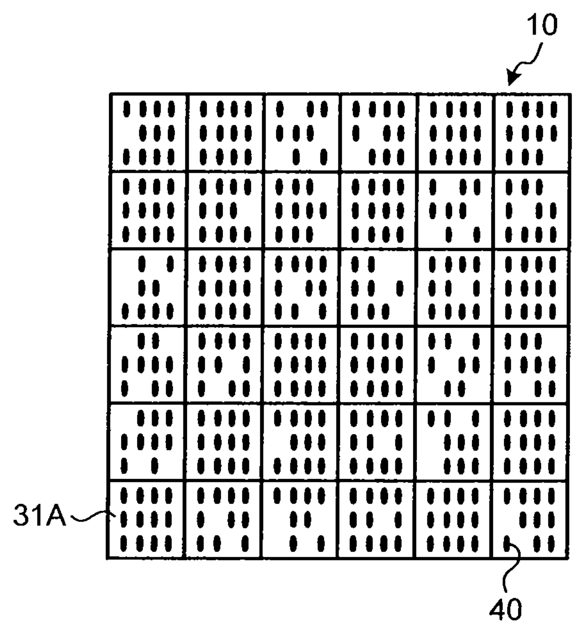
FIG. 7A is a view for explaining pattern regions set up in a mask.

FIG. 7A is a view for explaining pattern regions set up in the mask. For example, the mask 10 is divided into pattern regions that are rectangular regions (square regions or oblong rectangular regions) 31A. Then, in each of the rectangular regions 31A, the irradiation positions 40 of the laser light 7 are set up for the respective deformation modes.

For example, as regards the first rectangular region 31A, first and second deformation parameters are set up. Further, as regards the first rectangular region 31A, an irradiation position 41 (not shown) for the first deformation parameter and an irradiation position 42 (not shown) for the second deformation parameter are set up.

In this case, the first rectangular region 31A decreases its transmittance by irradiation with the laser light for the first deformation parameter and further decreases its transmittance by irradiation with the laser light for the second deformation parameter. Accordingly, when the transmittance of the first rectangular region 31A is calculated, the transmittance decrease associated with the first deformation parameter and the transmittance decrease associated with the second deformation parameter are summed up to each other.

Figure 7B:
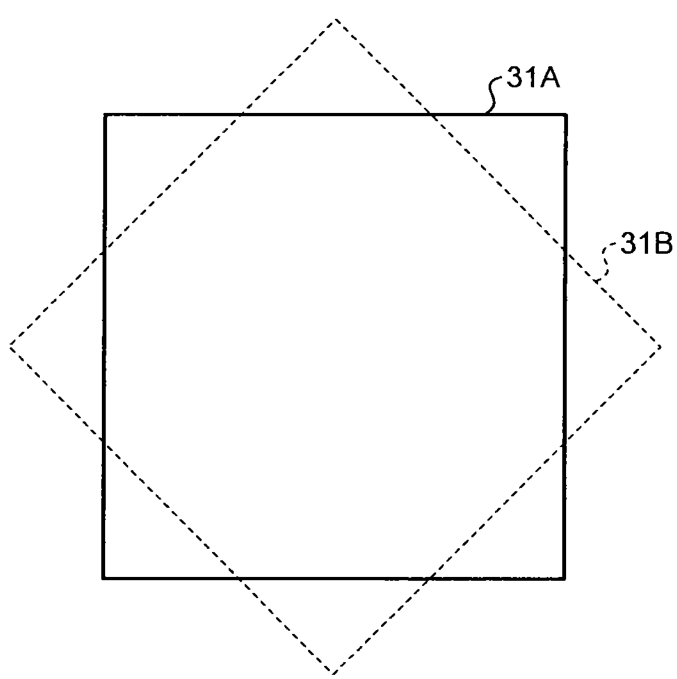
FIG. 7B is a view for explaining the summing of transmittances.

FIG. 7B is a view for explaining the summing of transmittances. For example, it is assumed that the first deformation parameter corresponds to the rotation angle=0°, and the second deformation parameter corresponds to the rotation angle=45°. In this case, if a rectangular region 31B of the second deformation parameter is obtained when the rectangular region 31A is rotated by 45°, the rectangular regions 31A and 31B are not overlaid each other, and so it becomes difficult to sum up the transmittance decreases. Further, if the rectangular region of the second deformation parameter is the same region as the rectangular region 31A, the second deformation parameter cannot be calculated by rotating the first deformation parameter by 90°.

Thus, according to this embodiment, the pattern regions are set up to have a shape in accordance with the rotation angle of the deformation parameter. For example, when the rotation angle of the deformation parameter is 90°, the pattern regions are set up to have a rectangular shape. Further, when the rotation angle of the deformation parameter are 60° or 120°, the pattern regions are set up to have a regular hexagonal shape or regular triangle shape.

Figure 8:
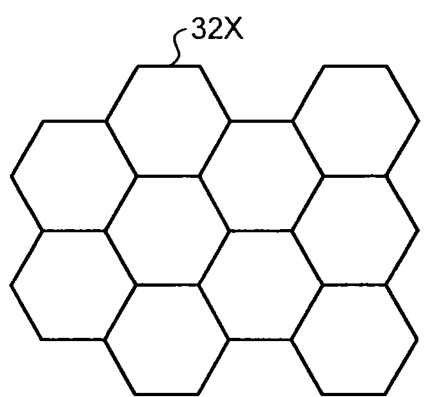
FIG. 8 is a view for explaining a pattern region divided with a regular hexagonal shape.
Figure 9:
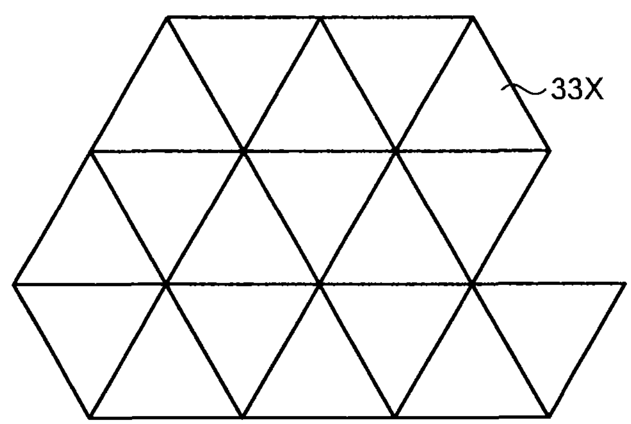
FIG. 9 is a view for explaining a pattern region divided with a regular triangle shape.

FIG. 8 is a view for explaining a pattern region divided with a regular hexagonal shape. Further, FIG. 9 is a view for explaining a pattern region divided with a regular triangle shape. As shown in FIG. 8, when the respective pattern regions of the mask 10 are set up by regular hexagonal regions 32X, the regular hexagonal region 32X can be arrayed in a state excluding a gap or overlap between them. Further, as shown in FIG. 9, when the respective pattern regions of the mask 10 are set up by regular triangle regions 33X, the regular triangle regions 33X can be arrayed in a state excluding a gap or overlap between them.

Figure 10A:
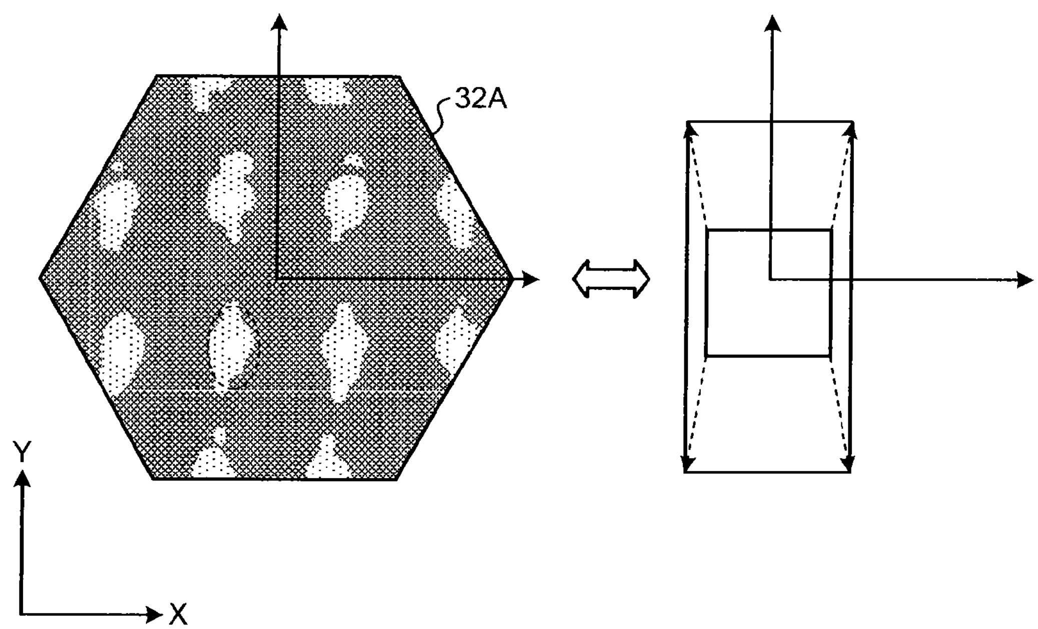
FIGS. 10A to 10C are views each showing a pattern region having a regular hexagonal shape and a deformation parameter.
Figure 10B:
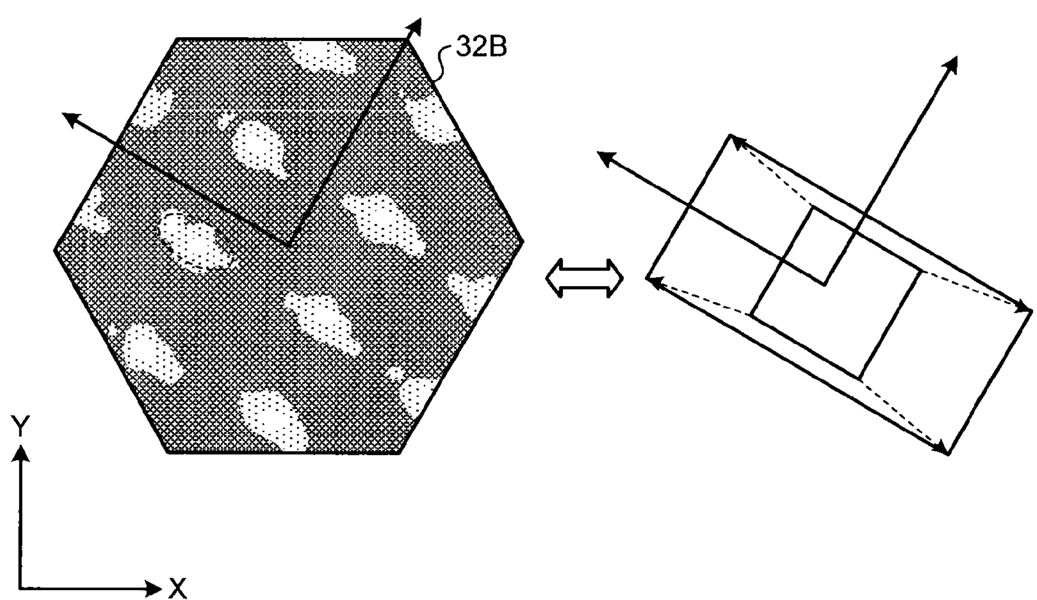
Figure 10C:
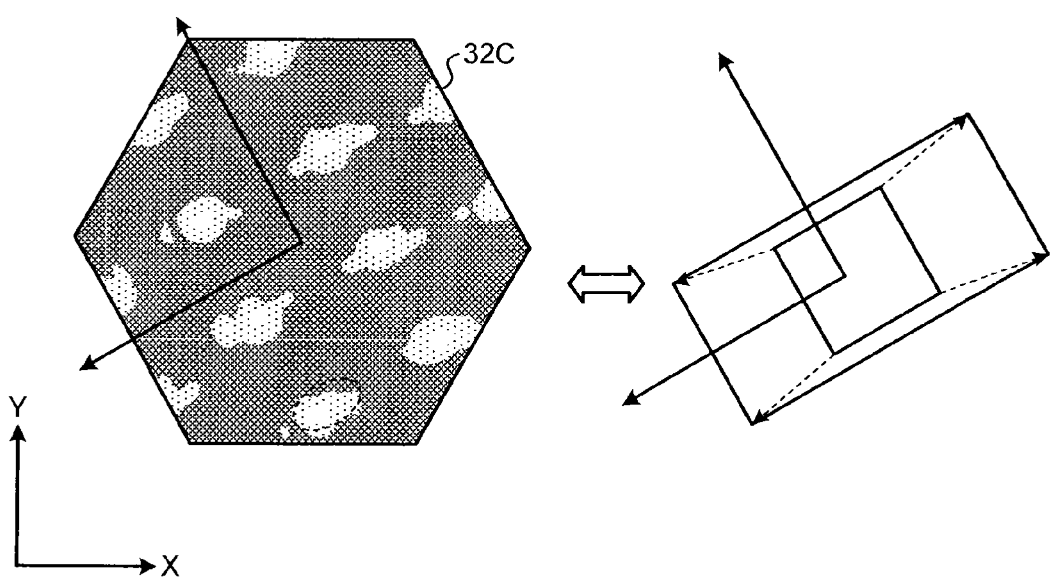

FIGS. 10A to 10C are views each showing a pattern region having a regular hexagonal shape and a deformation parameter. FIG. 10A shows a regular hexagonal region 32A serving as a pattern region when the rotation angle is 0°. Further, FIG. 10B shows a regular hexagonal region 32B serving as a pattern region when the rotation angle is 60°. Further, FIG. 10C shows a regular hexagonal region 32C serving as a pattern region when the rotation angle is 120°.

When the regular hexagonal region 32A is rotated by 60°, the regular hexagonal region 32A becomes the regular hexagonal region 32B, and the deformation parameter is also rotated by 60°. Further, when the regular hexagonal region 32A is rotated by 120°, the regular hexagonal region 32A becomes the regular hexagonal region 32C, and the deformation parameter is also rotated by 120°.

Consequently, the regular hexagonal regions 32A to 32C are the same region. Accordingly, the deformation parameters at the regular hexagonal regions 32A to 32C can be easily calculated, and the transmittance of the pattern region obtained by overlaying the regular hexagonal regions 32A to 32C can be also easily calculated. Thus, the irradiation positions of the laser light 7 can be easily calculated for the respective regular hexagonal regions 32A to 32C.

Incidentally, if the mask 10 is a template used for imprint lithography, there is no need to adjust the transmittance. Further, if the mask 10 is a reflection type photomask, there is no need to adjust the transmittance. Accordingly, the transmittance adjustment is performed if the mask 10 is a transmission type photomask or the like.

Figure 11:
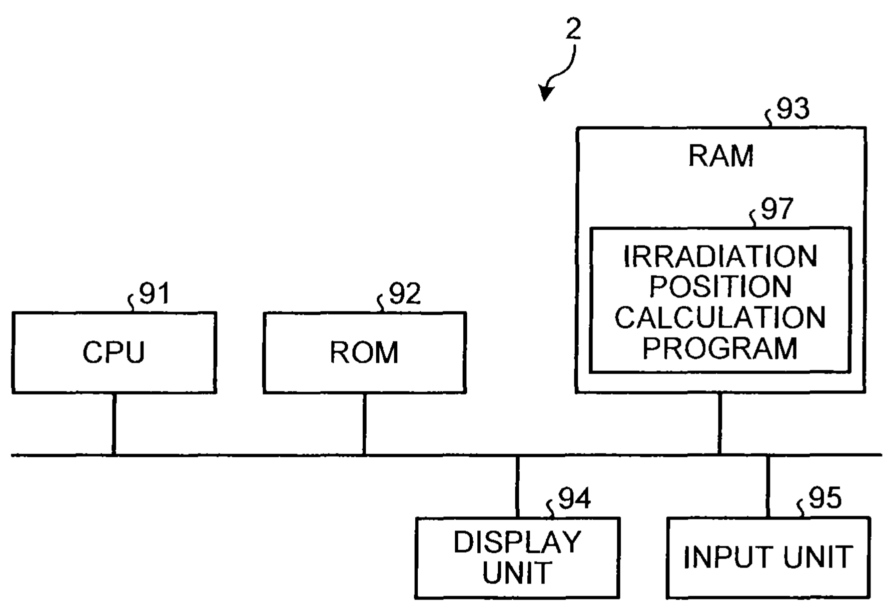
FIG. 11 is a diagram showing a hardware configuration of a control device.

Next, an explanation will be given of a hardware configuration of the control device 2. FIG. 11 is a diagram showing a hardware configuration of the control device. The control device 2 is a computer including a CPU (Central Processing Unit) 91, a ROM (Read Only Memory) 92, a RAM (Random Access Memory) 93, a display unit 94 and an input unit 95. In the control device 2, the CPU 91, the ROM 92, the RAM 93, the display unit 94, and the input unit 95 are connected to each other through a bus line.

The CPU 91 calculates the irradiation positions of the laser light 7 by use of an irradiation position calculation program 97 that is a computer program. The display unit 94 is a display device, such as a liquid crystal monitor, and is configured to display the deformation parameters, the deformation amounts of the mask 10, the irradiation positions of the laser light 7 and so forth, based on instructions from the CPU 91. The input unit 95 includes a mouse and a keyboard, and is configured to input instruction information (such as parameters necessary for calculating the irradiation positions), which is externally input by a user. The instruction information input into the input unit 95 is sent to the CPU 91.

The irradiation position calculation program 97 is stored in a recording medium, such as the ROM 92, and can be loaded into the RAM 93 through the bus line. For example, this recording medium is a nontransitory recording medium that can be read by computers (nontransitory computer readable medium).

The CPU 91 executes the irradiation position calculation program 97 loaded in the RAM 93. Specifically, the control device 2 is configured such that, in accordance with an instruction input by a user through the input unit 95, the CPU 91 reads the irradiation position calculation program 97 from the ROM 92, and develops it in a program storing region inside the RAM 93 to execute various operations. The CPU 91 temporarily stores various data generated during these various operations in a data storing region formed inside the RAM 93.

The irradiation position calculation program 97 executed in the control device 2 according to the embodiment has a module configuration including the irradiation position calculating unit 23, so that the irradiation position calculating unit 23 is generated on the main memory device.

Incidentally, the alignment operation device 8 includes a unit for calculating an alignment correction amount of the mask 10 (alignment correction amount calculating unit), which has a hardware configuration similar to the control device 2. Specifically, the alignment correction amount calculating unit is a computer including a CPU, a ROM, a RAM and an input unit. The CPU of the alignment correction amount calculating unit corrects the alignment position of the mask 10 by use of an alignment correction amount calculation program that is a computer program.

According to the embodiment, the mask processing apparatus 1 divides the pattern formation region on the mask 10 into pattern regions having a regular hexagonal shape or regular triangle shape. Then, the mask processing apparatus 1 sets up irradiation positions of the laser light 7, so that the transmittances of the respective pattern regions are equal to each other. Accordingly, if the rotation angles of the deformation parameters are 60° or 120°, images of the pattern formation region are overlaid when the pattern formation region is rotated by 60° or 120°. Consequently, the mask processing apparatus 1 can easily calculate the irradiation positions of the laser light 7.

Thus, the second embodiment can provide an effect that allows the correction of the mask 10 to be performed with high accuracy in a short time.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A mask processing apparatus comprising:

a stage configured to hold a mask formed with a pattern to be transferred to a transfer target substrate;

a laser light source configured to output laser light that is radiated into the mask and thereby alters the mask;

a rotary mechanism configured to rotate the stage in an in-plane direction of a pattern formation surface of the mask; and a deformation parameter calculating device configured to calculate a second deformation parameter representing an irradiation shape of the laser light for when the mask is rotated to a second rotation angle, based on a first deformation parameter representing an irradiation shape of the laser light for when the mask is rotated to a first rotation angle, the deformation parameter calculating device being configured to calculate the second deformation parameter by rotating the first deformation parameter by an amount corresponding to a difference between the first rotation angle and the second rotation angle.

2. The mask processing apparatus according to claim 1, further comprising a control device configured to calculate irradiation positions of the laser light relative to the mask, for respective rotation angles in the in-plane direction, based on deformation amounts of the pattern, and to control the laser light source and the rotary mechanism based on calculation results.

3. The mask processing apparatus according to claim 1, further comprising an alignment operation device configured to perform an alignment operation of the mask at each of rotation angles of the mask when the rotary mechanism rotates the stage.

4. A mask processing apparatus comprising:

a stage configured to hold a mask formed with a pattern to be transferred to a transfer target substrate;

a laser light source configured to output laser light that is radiated into the mask and thereby alters the mask;

a rotary mechanism configured to rotate the stage in an in-plane direction of a pattern formation surface of the mask; and a deformation parameter calculating device configured to calculate a second deformation parameter representing an irradiation shape of the laser light for when the mask is rotated to a second rotation angle, based on a first deformation parameter representing an irradiation shape of the laser light for when the mask is rotated to a first rotation angle, the deformation parameter calculating device being configured to calculate a third deformation parameter representing an irradiation shape of the laser light for when the mask is rotated to a third rotation angle, and a fourth deformation parameter representing an irradiation shape of the laser light for when the mask is rotated to a fourth rotation angle, based on the first deformation parameter representing an irradiation shape of the laser light for when the mask is rotated to the first rotation angle.

5. The mask processing apparatus according to claim 4, further comprising a control device configured to calculate irradiation positions of the laser light relative to the mask, for respective rotation angles in the in-plane direction, based on deformation amounts of the pattern, and to control the laser light source and the rotary mechanism based on calculation results.

6. The mask processing apparatus according to claim 4, wherein the deformation parameter calculating device is configured to calculate the third deformation parameter by rotating the first deformation parameter by an amount corresponding to a difference between the first rotation angle and the third rotation angle, and to calculate the fourth deformation parameter by rotating the first deformation parameter by an amount corresponding to a difference between the first rotation angle and the fourth rotation angle.

7. The mask processing apparatus according to claim 6, wherein the deformation parameter calculating device is configured to divide the pattern formation region on the mask into pattern regions having a regular hexagonal shape or regular triangle shape, and to calculate irradiation positions of the laser light such that a transmittance of the laser light and a position correction amount of the pattern are set at desired values for each of the pattern regions.

8. The mask processing apparatus according to claim 6, wherein the deformation parameter calculating device is configured to set 60° as a difference between the first rotation angle and the third rotation angle, and to set 120° as a difference between the first rotation angle and the fourth rotation angle.

9. The mask processing apparatus according to claim 4, further comprising an alignment operation device configured to perform an alignment operation of the mask at each of rotation angles of the mask when the rotary mechanism rotates the stage.

10. The mask processing apparatus according to claim 9, wherein the rotary mechanism is configured to rotate the stage and the mask to a plurality of rotation angles, and the mask is subjected to the alignment operation and irradiation with the laser light in each of states rotated to the rotation angles.

11. A mask processing method comprising:

causing a stage to hold a mask formed with a pattern to be transferred to a transfer target substrate;

causing a rotary mechanism to rotate the stage in an in-plane direction of a pattern formation surface of the mask;

causing a laser light source to output laser light that is radiated into the mask and thereby alters the mask, at each of rotation angles in the in-plane direction;

causing a deformation parameter calculating device to calculate a second deformation parameter representing an irradiation shape of the laser light for when the mask is rotated to a second rotation angle, based on a first deformation parameter representing an irradiation shape of the laser light for when the mask is rotated to a first rotation angle; and causing the deformation parameter calculating device to calculate the second deformation parameter by rotating the first deformation parameter by an amount corresponding to a difference between the first rotation angle and the second rotation angle.

12. The mask processing method according to claim 11, further comprising causing a control device to calculate irradiation positions of the laser light relative to the mask, for respective rotation angles in the in-plane direction, based on deformation amounts of the pattern, and to control the laser light source and the rotary mechanism based on calculation results.

13. The mask processing method according to claim 11, comprising causing the deformation parameter calculating device to calculate a third deformation parameter representing an irradiation shape of the laser light for when the mask is rotated to a third rotation angle, and a fourth deformation parameter representing an irradiation shape of the laser light for when the mask is rotated to a fourth rotation angle, based on the first deformation parameter representing an irradiation shape of the laser light for when the mask is rotated to the first rotation angle.

14. The mask processing method according to claim 13, comprising causing the deformation parameter calculating device to calculate the third deformation parameter by rotating the first deformation parameter by an amount corresponding to a difference between the first rotation angle and the third rotation angle, and to calculate the fourth deformation parameter by rotating the first deformation parameter by an amount corresponding to a difference between the first rotation angle and the fourth rotation angle.

15. The mask processing method according to claim 14, further comprising causing the deformation parameter calculating device to divide the pattern formation region on the mask into pattern regions having a regular hexagonal shape or regular triangle shape, and to calculate irradiation positions of the laser light such that a transmittance of the laser light and a position correction amount of the pattern are set at desired values for each of the pattern regions.

16. The mask processing method according to claim 14, comprising causing the deformation parameter calculating device to set 60° as a difference between the first rotation angle and the third rotation angle, and to set 120° as a difference between the first rotation angle and the fourth rotation angle.

17. The mask processing method according to claim 11, further comprising causing an alignment operation device to perform an alignment operation of the mask at each of rotation angles of the mask when the rotary mechanism rotates the stage.

* * * * *

UNITED STATES PATENT AND TRADEMARK OFFICE
CERTIFICATE OF CORRECTION

PATENT NO. : 9,632,407 B2
APPLICATION NO. : 14/483805
DATED : April 25, 2017
INVENTOR(S) : Sato et al.

It is certified that error appears in the above-identified patent and that said Letters Patent is hereby corrected as shown below:

On the Title Page

Item (73), the Assignee's name is incorrect. Item (73) should read:
-- (73) Assignee: Kabushiki Kaisha Toshiba, Minato-ku
(JP) --

Signed and Sealed this
Tenth Day of July, 2018

Andrei Iancu
*Director of the United States Patent and Trademark Office*